(12) United States Patent
Shin et al.

(10) Patent No.: US 10,754,222 B2
(45) Date of Patent: Aug. 25, 2020

(54) LIGHT STEERING APPARATUS AND SYSTEM INCLUDING THE LIGHT STEERING APPARATUS

(71) Applicant: SAMSUNG ELECTRONICS CO., LTD., Suwon-si (KR)

(72) Inventors: Changgyun Shin, Anyang-si (KR); Dongjae Shin, Seoul (KR); Dongsik Shim, Hwaseong-si (KR); Changbum Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/190,912

(22) Filed: Nov. 14, 2018

(65) Prior Publication Data

US 2019/0391459 A1    Dec. 26, 2019

(30) Foreign Application Priority Data

Jun. 20, 2018 (KR) .................. 10-2018-0070905

(51) Int. Cl.
| | |
|---|---|
| *G02F 1/295* | (2006.01) |
| *H01S 5/14* | (2006.01) |
| *H01S 5/06* | (2006.01) |
| *H01S 5/40* | (2006.01) |
| *H01S 3/10* | (2006.01) |
| *H01S 5/00* | (2006.01) |
| *H01S 5/02* | (2006.01) |

(Continued)

(52) U.S. Cl.
CPC ........ *G02F 1/2955* (2013.01); *H01S 3/10053* (2013.01); *H01S 5/0071* (2013.01); *H01S 5/021* (2013.01); *H01S 5/0612* (2013.01); *H01S 5/142* (2013.01); *H01S 5/4068* (2013.01); *H01S 5/4075* (2013.01); *H01S 3/0637* (2013.01); *H01S 5/0261* (2013.01)

(58) Field of Classification Search
None
See application file for complete search history.

(56) References Cited

U.S. PATENT DOCUMENTS

| | | |
|---|---|---|
| 6,668,006 B1 | 12/2003 | Margalit et al. |
| 8,467,122 B2 | 6/2013 | Zheng et al. |
| 9,130,342 B2 | 9/2015 | Liang et al. |

(Continued)

FOREIGN PATENT DOCUMENTS

| | | | |
|---|---|---|---|
| EP | 2645496 A1 * | 10/2013 | ........... H01S 5/1071 |
| JP | 2003-527625 A | 9/2003 | |
| KR | 10-0916311 B1 | 9/2009 | |

OTHER PUBLICATIONS

Communication dated Jul. 23, 2019 issued by the European Patent Office in counterpart European Application No. 18207853.5.

(Continued)

*Primary Examiner* — Michelle R Connelly
(74) *Attorney, Agent, or Firm* — Sughrue Mion, PLLC (57) ABSTRACT

A light steering apparatus is provided including a tunable laser source and a system including the light steering apparatus. The light steering apparatus includes the tunable laser source and a steering device. A plurality of laser beams having optical coherence with each other and output from the tunable laser source are incident onto the steering device, and the steering device includes a plurality of modulation units for beam steering.

16 Claims, 9 Drawing Sheets

(51) Int. Cl.
*H01S 3/063* (2006.01)
*H01S 5/026* (2006.01)

(56) References Cited

U.S. PATENT DOCUMENTS

| | | | |
|---|---|---|---|
| 2003/0058908 A1* | 3/2003 | Griffel | H01S 5/1032 |
| | | | 372/43.01 |
| 2003/0219045 A1 | 11/2003 | Orenstein et al. | |
| 2009/0154505 A1* | 6/2009 | Oh | G02B 6/12007 |
| | | | 372/20 |
| 2012/0189025 A1 | 7/2012 | Zheng et al. | |
| 2017/0016990 A1* | 1/2017 | Yaacobi | G01S 17/36 |
| 2018/0107091 A1* | 4/2018 | Hosseini | G02F 1/292 |
| 2018/0210394 A1* | 7/2018 | Favalora | H04N 13/305 |
| 2018/0252983 A1* | 9/2018 | Pruessner | G01S 7/4813 |
| 2018/0306925 A1* | 10/2018 | Hosseini | G02B 27/286 |
| 2019/0027898 A1* | 1/2019 | Bovington | H01S 5/1071 |
| 2019/0056634 A1* | 2/2019 | Hosseini | G02F 1/292 |
| 2019/0243000 A1* | 8/2019 | Shim | B60Q 9/008 |

OTHER PUBLICATIONS

J.C. Hulme et al., "Fully integrated hybrid silicon two dimensional beam scanner", Optics Express, vol. 23, No. 5, Feb. 25, 2015, pp. 5861-5874, 14 pages total, XP055455951.

Hideo Itoh et al., "Interconnection Architecture Based On Beam-Steering Devices", IEICE Transactions On Electronics, vol. E77-C, No. 1, Jan. 1994, pp. 15-22, XP000439962.

Martijn J.R. Heck, "Highly integrated optical phased arrays: photonic integrated circuits for optical beam shaping and beam steering", Nanophotonics, vol. 6, No. 1, Jun. 25, 2016, pp. 93-107, 15 pages total, XP055455944.

* cited by examiner

LIGHT STEERING APPARATUS AND SYSTEM INCLUDING THE LIGHT STEERING APPARATUS

CROSS-REFERENCE TO RELATED APPLICATION

This application claims priority from Korean Patent Application No. 10-2018-0070905, filed on Jun. 20, 2018, in the Korean Intellectual Property Office, the disclosure of which is incorporated herein in its entirety by reference.

BACKGROUND

1. Field

Apparatuses consistent with example embodiments relate to a light steering apparatus, and more particularly, to a light steering apparatus using a tunable laser source, and a system including the light steering apparatus

2. Description of the Related Art

To steer a laser beam to a desired position, a method of mechanically rotating a laser-output portion and a method of using coherence of a bundle of laser beams output from a plurality of unit cells or a plurality of waveguides by using an optical phased array (OPA) method that is a non-mechanical drive method have been used. Particularly, research has been carried out on a light steering apparatus in which a light emission angle according to the characteristics of a diffraction grating is controlled by using a tunable laser source as a light source to achieve two-dimensional light steering using a diffraction structure arranged in one dimension.

SUMMARY

One or more example embodiments may provide a light steering apparatus using a tunable laser light source, and a system including the light steering apparatus.

Additional example aspects will be set forth in part in the description which follows and, in part, will be apparent from the description, or may be learned by practice of the presented example embodiments.

According to an aspect of an example embodiment, a light steering apparatus includes a tunable laser source; and a steering device, on which a plurality of laser beams having optical coherence with each other and output from the tunable laser source are incident, the steering device including a plurality of modulation units for beam steering.

The tunable laser source and the steering device may be connected to each other via a plurality of input/output connection structures corresponding to the plurality of laser beams.

The tunable laser source may include a first waveguide and a second waveguide; and a first ring resonator and a second ring resonator spaced apart from each other between the first and second waveguides.

The tunable laser source may include an optical amplifier on at least one of the first and second waveguides.

Each of the first and second ring resonators may include a ring waveguide and a modulator.

The modulator may include a heating element configured to heat the ring waveguide, an electrode element configured to change a current density of the ring waveguide by applying a current around the ring waveguide, or a piezoelectric element configured to change a refractive index of the ring waveguide or its surroundings by modification according to application of a voltage.

The plurality of laser beams may include a first laser beam and a second laser beam respectively output from one side of the first waveguide and one side of the second waveguide such that the optical coherence is guaranteed, the one side of the first waveguide and the one side of the second waveguide being located in a diagonal direction with respect to each other.

A first output port and a second output port may be respectively provided at both sides of the first waveguide, and a third output port and a fourth output port may be respectively provided at both sides of the second waveguide.

The steering device may include a third waveguide and a fourth waveguide on which the first and second laser beams are incident, respectively.

The first waveguide and the third waveguide may be integrally formed, and the second waveguide and the fourth waveguide may be integrally formed.

The steering device may further include a splitter configured to split each of the third and fourth waveguides into a plurality of waveguides.

The plurality of modulation units may be configured to modulate phases of beams that pass through the third and fourth waveguides that are split.

A time-independent phase difference may exist between the first and second laser beams.

The light steering apparatus may further include a phase difference compensation device configured to compensate for a phase difference between the first and second laser beams.

The phase difference compensation device may be provided on at least one of a path of the first laser beam and a path of the second laser beam and further configured to apply an electrical signal corresponding to the phase difference between the first and second laser beams.

At least one of the plurality of modulation units may be configured to apply an electrical signal corresponding to the phase difference between the first and second laser beams.

Light output portions of the steering device may be arranged in a form of a one-dimensional array.

According to an aspect of another example embodiment, a system includes a tunable laser source, a steering device, on which a plurality of laser beams having optical coherence with each other and output from the tunable laser source are incident, the steering device including a plurality of modulation units for beam steering, and a detection unit configured to detect a beam steered by the steering device.

The tunable laser source may include a first waveguide and a second waveguide, a first ring resonator and a second ring resonator spaced apart from each other between the first and second waveguides, and an optical amplifier provided on at least one of the first and second waveguides.

The plurality of laser beams may include a first laser beam and a second laser beam respectively output from one side of the first waveguide and one side of the second waveguide such that the optical coherence is guaranteed, the one side of the first waveguide and the one side of the second waveguide being located in a diagonal direction with respect to each other.

BRIEF DESCRIPTION OF THE DRAWINGS

These and/or other example aspects and advantages will become apparent and more readily appreciated from the following description of example embodiments, taken in conjunction with the accompanying drawings in which.

DETAILED DESCRIPTION

Reference will now be made in detail to example embodiments which are illustrated in the accompanying drawings, wherein like reference numerals refer to like elements throughout. Also, the size of each layer illustrated in the drawings may be exaggerated for convenience of explanation and clarity. In this regard, the present example embodiments may have different forms and should not be construed as being limited to the descriptions set forth herein. Accordingly, the example embodiments are merely described below, by referring to the figures, to explain aspects of the present description. In a layer structure, when a constituent element is disposed "above" or "on" to another constituent element, the constituent element may be only directly on the other constituent element or above the other constituent elements in a non-contact manner.

Figure 1:
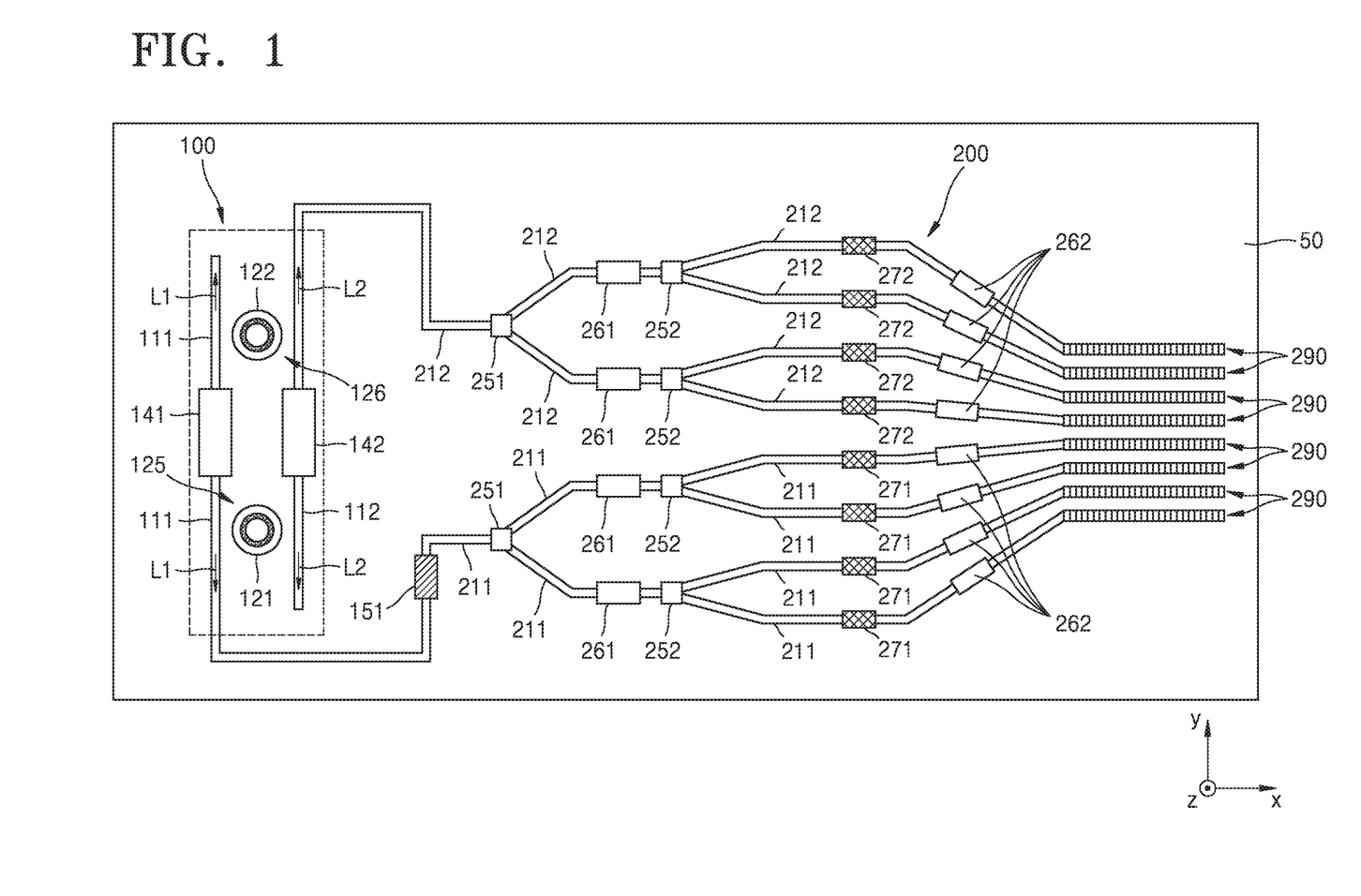
FIG. 1 is a plan view of a light steering apparatus according to an example embodiment.

FIG. 1 is a plan view of a light steering apparatus according to an example embodiment.

Referring to FIG. 1, a light steering apparatus may include a tunable laser source 100 and a steering device 200 for steering light output from the tunable laser source 100 in a desired direction. The tunable laser source 100 and the steering device 200 may be integrated on a substrate 50. For example, a silicon substrate may be used as the substrate 50. However, the present disclosure is not limited thereto, and substrates having any of various materials may be used therefor. A clad layer 51 (shown in FIG. 3) may be provided on an upper surface of the substrate 50. Although the clad layer 51 may include, for example, a silicon oxide, the present disclosure is not limited thereto. The tunable laser source 100 may vary the wavelength of a laser beam to a wide bandwidth, as described below.

Figure 2:
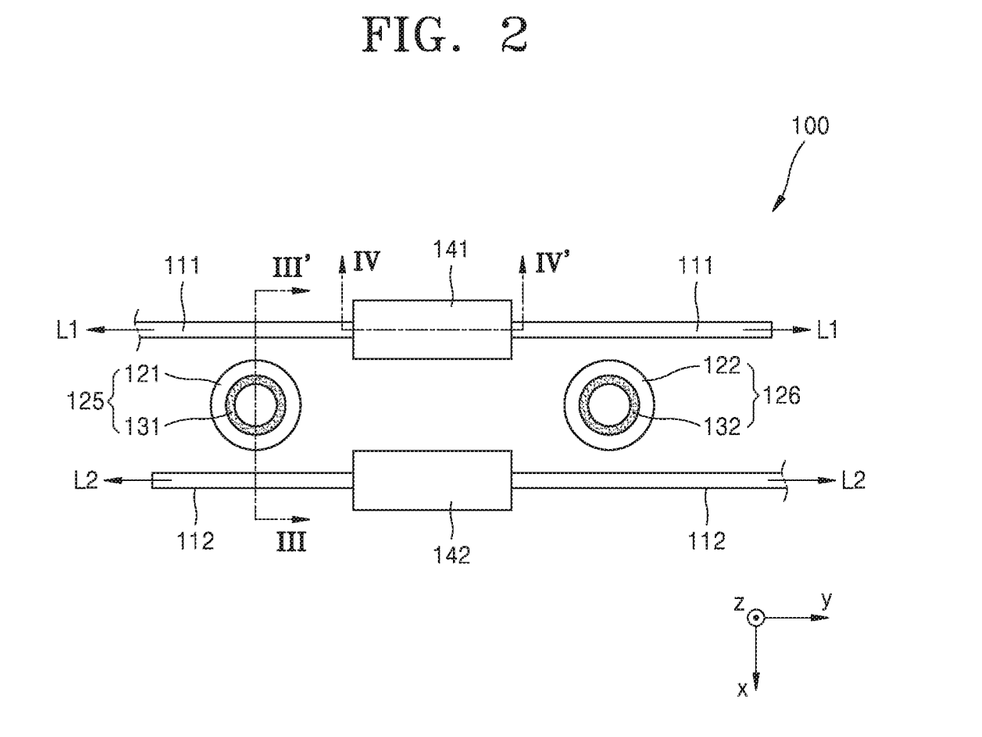
FIG. 2 is an enlarged view of a tunable laser source of FIG. 1.
Figure 3:
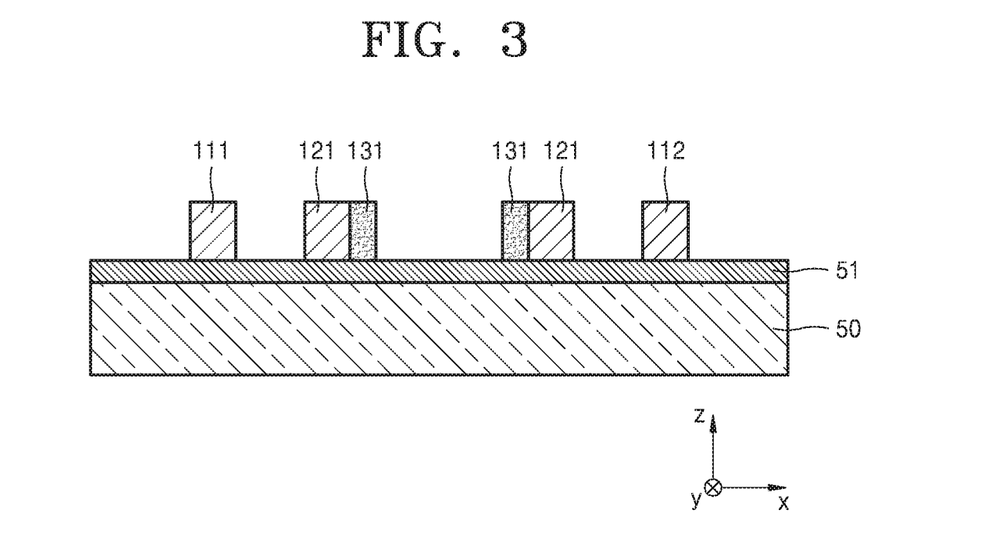
FIG. 3 is a cross-sectional view taken along line III-III' of FIG. 2.
Figure 4:
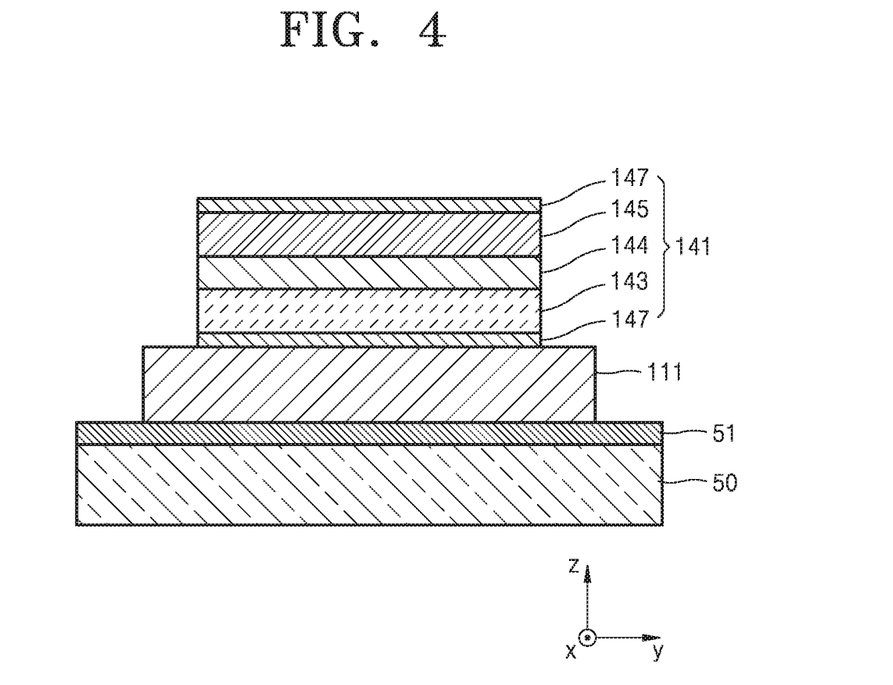
FIG. 4 is a cross-sectional view taken along line IV-IV' of FIG. 2.

FIG. 2 is an enlarged view of the tunable laser source 100 of FIG. 1. FIG. 3 is a cross-sectional view taken along line III-III' of FIG. 2. FIG. 4 is a cross-sectional view taken along line IV-IV' of FIG. 2.

Referring to FIGS. 2 to 4, the tunable laser source 100 may be, for example, a tunable laser diode. The tunable laser source 100 may include first and second waveguides 111 and 112 and first and second ring resonators 125 and 126 provided between the first and second waveguides 111 and 112.

The first and second waveguides 111 and 112 may be arranged, for example, parallel to each other. The first and second waveguides 111 and 112 may each include a semiconductor material. For example, the first and second waveguides 111 and 112 may each include silicon. However, this is exemplary, and the first and second waveguides 111 and 112 may include any of various other materials. The first and second waveguides 111 and 112 may be provided with first and second optical amplifiers 141 and 142 that are described later, respectively.

The first and second ring resonators 125 and 126 may be spaced apart from each other between the first and second waveguides 111 and 112. In FIG. 3, a cross-section of the first ring resonator 125 is exemplarily illustrated, and the second ring resonator 126 may have the same cross-sectional structure as the first ring resonator 125. The first ring resonator 125 may include a first ring waveguide 121 and a first modulator 131. The second ring resonator 126 may include a second ring waveguide 122 and a second modulator 132.

The first and second ring waveguides 121 and 122 may include the same material such as that of the first and second waveguides 111 and 112, for example a semiconductor material such as silicon. The first modulator 131 may modulate a propagation constant of the first ring waveguide 121, and the second modulator 132 may modulate a propagation constant of the second ring waveguide 122.

Each of the first and second modulators 131 and 132 may include, for example, a heating element, an electro-optic element, or a piezoelectric element. The heating element may change the refractive index of the corresponding ring waveguide by thermo-optic effect, thereby varying resonant wavelength within a wide range. The electro-optic element may change a charge density in the corresponding one of the first and second ring waveguides 121 and 122 by applying a current around the corresponding ring waveguide, and change the refractive index of the corresponding ring waveguide by electro-optic effect, thereby varying resonant wavelength within a wide range. The piezoelectric element may change the refractive index of the corresponding one of the first and second ring waveguides 121 and 122, or a material surrounding the corresponding one of the first and second ring waveguides 121 and 122, due to deformation according to the application of a voltage, thereby varying resonant wavelength within a wide range.

Although FIG. 2 exemplarily illustrates a case in which the first and second modulators 131 and 132 are respectively provided inside the first and second ring waveguides 121 and 122, the example embodiments are not limited thereto, and the shapes and positions of the first and second modulators 131 and 132 may be modified in any of various ways.

The first and second optical amplifiers 141 and 142 may be respectively provided on the first and second waveguides 111 and 112. The first optical amplifier 141 may be provided on the first waveguide 111 between the first and second ring resonators 125 and 126, and the second optical amplifier 142 may be provided on the second waveguide 112 between the first and second ring resonators 125 and 126. The first and second optical amplifiers 141 and 142 may include, for example, a semiconductor optical amplifier or an ion doped amplifier. The first and second optical amplifiers 141 and 142 may simultaneously perform light amplification and light generation.

FIG. 4 is a schematic cross-sectional view of the first optical amplifier 141 of the first and second optical amplifiers 141 and 142 that are semiconductor optical amplifiers. The second optical amplifier 142 may have the same sectional structure as the first optical amplifier 141. Referring to FIG. 4, the first optical amplifier 141 may include, for example, a lower clad layer 143, an active layer 144, and an upper clad layer 145. The lower clad layer 143 and the upper clad layer 145 may include, for example, a III-V group compound semiconductor material or a II-VI group compound semiconductor material. The active layer 144 may include, for example, InGaAs, InGaNAs, InGaAsP, or InAlGaAs. The lower clad layer 143 and the upper clad layer 145 may include a semiconductor material having a bandgap greater than a bandgap of the active layer 144. The lower clad layer 143 and the upper clad layer 145 may include, for example, GaAs, GaP, AlGaAs, InGaP, GaAs, or InP. A material forming the first optical amplifier 141 may be selected according to the wavelength of light to be amplified (or bandgap). For example, when light having a wavelength of about 1.55 μm is to be amplified, an InP/InGaAs material may be used for the lower and upper clad layers 143 and 145 and the active layer 144.

A conductive layer 147 may be provided on the lower clad layer 143 and the upper clad layer 145. The conductive layer 147 may include, for example, at least one of materials selected from a group consisting of Ti, Au, Ag, Pt, Cu, Al, Ni, and Cr, an alloy thereof, or a stacked layer thereof. However, the example embodiment is not limited thereto, and the conductive layer 147 may include at least one of, for example, indium-tin-oxide (ITO), indium-zinc-oxide (IZO), Ga—In—Zn-oxide (GIZO), Al—Zn-oxide (AZO), Ga—Zn-oxide (GZO), and ZnO. The conductive layer 147 may be used as an electrode or a separate electrode may be coupled to the conductive layer 147.

The first optical amplifier 141 or the second optical amplifier 142, which is a semiconductor optical amplifier, does not need a separate exciting laser, and an optical signal may be generated and amplified by applying an electric field to both sides of the first and second waveguides 111 and 112. In detail, when an electric filed is applied through the conductive layer 147, absorption of photons and stimulated emission occur. When the photons are absorbed, electron-hole pairs are generated. In contrast, when the electron-hole pairs are combined, stimulated emission of photons occurs. To amplify an optical signal, the stimulated emission of photons occurs more than the absorption of photons. The semiconductor optical amplifier may include a Fabry-Perot Amplifier (FPA) type and a Traveling Wave Amplifier (TWA) type. According to the FPA type, population inversion occurs in a conductive band that is of a high energy level due to an injection current, and thus stimulated emission may occur due to transition to a valence band that is of a low energy level and may be amplified by a resonator. According to the TWA type, both end facets of a semiconductor laser are coated by an anti-reflection layer to restrict reflection from an emitting surface, and a resonance phenomenon is restricted so that a gain bandwidth may be increased as compared to the FPA type. The first and second optical amplifiers 141 and 142 may have widths greater than those of the first and second waveguides 111 and 112. Accordingly, the loss of light transmitted through the first and second waveguides 111 and 112 during movement toward the first and second optical amplifiers 141 and 142 may be reduced.

In the tunable laser source 100 having the above structure, light generated from at least one of the first optical amplifier 141 and the second optical amplifier 142 may be amplified by passing through the first and second ring resonators 125 and 126 clockwise and counterclockwise and then may be output to the outside with a desired oscillation wavelength through the first and second waveguides 111 and 112. For example, as illustrated in FIG. 2, a first laser beam L1 may be output from both sides of the first waveguide 111, and a second laser beam L2 may be output from both sides of the second waveguide 112. In this state, the first laser beams L1 that are output from both sides of the first waveguide 111 and the second laser beams L2 that are output from both sides of the second waveguide 112 may have the same wavelength and same output power.

The first and second laser beams L1 and L2, output from opposite ends of the first and second waveguides (i.e. located in a diagonal direction with respect to each other, as shown in FIG. 2), from among all of the first and second laser beams L1 and L2 output from the tunable laser source 100, have guaranteed optical coherence with each other. For example, in FIG. 2, the first laser beam L1 output from one side of the first waveguide 111, that is, the first waveguide 111 located at the left side of the first optical amplifier 141, and the second laser beam L2 output from another side of the second waveguide 112 located in a diagonal direction with respect to the one side of the first waveguide 111, that is, the second waveguide 112 at the right side of the second optical amplifier 142, may have guaranteed optical coherence with each other. As such, when the first and second laser beams L1 and L2 having optical coherence with each other are used for the light steering apparatus, about twice the optical output power may be obtained while consuming the same power, as compared to a case of using a single laser beam.

Meanwhile, the first laser beam L1 output from the other side of the first waveguide 111, that is, the first waveguide 111 located at the right side of the first optical amplifier 141, and the second laser beam L2 output from the one side of the second waveguide 112 located in a diagonal direction to the other side of the first waveguide 111, that is, the second waveguide 112 at the left side of the second optical amplifier 142, may have guaranteed optical coherence with each other, which is discussed in a below-described example embodiment.

There may be a phase difference between the first and second laser beams L1 and L2 having optical coherence. However, since the phase difference in this case is a time-independent phase difference, the phase difference issue may be solved by compensating for a phase difference of any one of the first and second laser beams L1 and L2 by using a phase difference compensation device as described below. Although, in the above description, the first and second waveguides 111 and 112 are provided with the first and second optical amplifiers 141 and 142, respectively, an optical amplifier may be provided for only one of the first and second waveguides 111 and 112.

Referring back to FIG. 1, the steering device 200 may steer light in a desired direction by using the above-described first and second laser beams L1 and L2 having optical coherence and output from the tunable laser source 100. The steering device 200 may include third and fourth waveguides 211 and 212, a plurality of splitters 251 and 252, and a plurality of modulation units 271 and 272.

The first laser beam L1 output from one side of the first waveguide 111 of the tunable laser source 100 may be incident on the third waveguide 211 of the steering device 200, and the second laser beam L2 output from another side of the second waveguide 112 of the tunable laser source 100 may be incident on the fourth waveguide 212 of the steering device 200. The third and fourth waveguides 211 and 212 may include a semiconductor material, for example, silicon. However, this is exemplary, and the third and fourth waveguides 211 and 212 may include any other various materials.

The third waveguide 211 of the steering device 200 may be formed integrally with the first waveguide 111 of the tunable laser source 100, and the fourth waveguide 212 of the steering device 200 may be formed integrally with the second waveguide 112 of the tunable laser source 100.

A phase difference compensation device 151 may be provided on the third waveguide 211. As described above, a time-independent phase difference may be present between the first and second laser beams L1 and L2 having optical coherence incident on the third and fourth waveguides 211 and 212. The phase difference compensation device 151 may compensate for a phase difference between the first and second laser beams L1 and L2 by applying an electrical signal corresponding to the phase difference between the first and second laser beams L1 and L2 to the third waveguide 211 through which the first laser beam L1 passes. Accordingly, the first laser beam L1 passing through the third waveguide 211 via the phase difference compensation device 151 may have the same phase as the second laser beam L2 passing through the fourth waveguide 212.

Although FIG. 1 exemplarily illustrates a case in which the phase difference compensation device 151 is provided on the third waveguide 211 of the steering device 200, the phase difference compensation device 151 may be provided on the first waveguide 111 of the tunable laser source 100. Furthermore, the phase difference compensation device 151 may be provided on the fourth waveguide 212, or on both of the third and fourth waveguides 211 and 212.

The splitters 251 and 252 may respectively split the third and fourth waveguides 211 and 212 into a plurality of waveguides. In FIG. 1, the third and fourth waveguides 211 and 212 are respectively split by the first and second the splitters 251 and 252 into four waveguides, and thus a case in which the third and fourth waveguides 211 and 212 having a total of eight (8) pieces are illustrated. However, this is exemplary, and the number of the splitters 251 and 252 and the number of the third and fourth waveguides 211 and 212 that are split may be modified in any of various ways.

The modulation units 271 and 272 may respectively modulate phases of the first and second laser beams L1 and L2 that pass through the third and fourth waveguides 211 and 212 that are split. In this state, the modulation units 271 and 272 may independently modulate the phases of the first and second laser beams L1 and L2 that respectively pass through the third and fourth waveguides 211 and 212. Accordingly, phase profiles of the first and second laser beams L1 and L2 that respectively pass through the third and fourth waveguides 211 and 212 via the modulation units 271 and 272 may be formed.

To modulate the phases of the first and second laser beams L1 and L2 that respectively pass through the third and fourth waveguides 211 and 212, for example, a method of changing the refractive indexes of the third and fourth waveguides 211 and 212 by applying heat or an electrical signal to the third and fourth waveguides 211 and 212 via the modulation units 271 and 272 may be used. As another method, each of the modulation units 271 and 272 includes a clad layer (not shown) having a refractive index which varies according to application of an electrical signal, and by applying an electrical signal to the clad layer, the refractive index of the clad layer is changed, thereby changing the phases of the first and second laser beams L1 and L2 that pass through the third and fourth waveguides 211 and 212.

The modulation units 271 and 272 may include the first modulation units 271 provided on the third waveguides 211 that are split and the second modulation units 272 provide on the fourth waveguides 212 that are split. Each of the first modulation units 271 may independently modulate the phase of the first laser beam L1 that passes through each of the third waveguides 211, and each of the second modulation units 272 may independently modulate the phase of the second laser beam L2 that passes through each of the fourth waveguides 212.

The first and second laser beams L1 and L2 having phases that are independently modulated by the first and second modulation units 271 and 272 may be output to the outside through the light output portions 290 provided at end portions of the third and fourth waveguides 211 and 212. The light output portions 290 of the steering device 200 may be arranged on the substrate 50 in the form of one-dimensional array.

Figure 5:
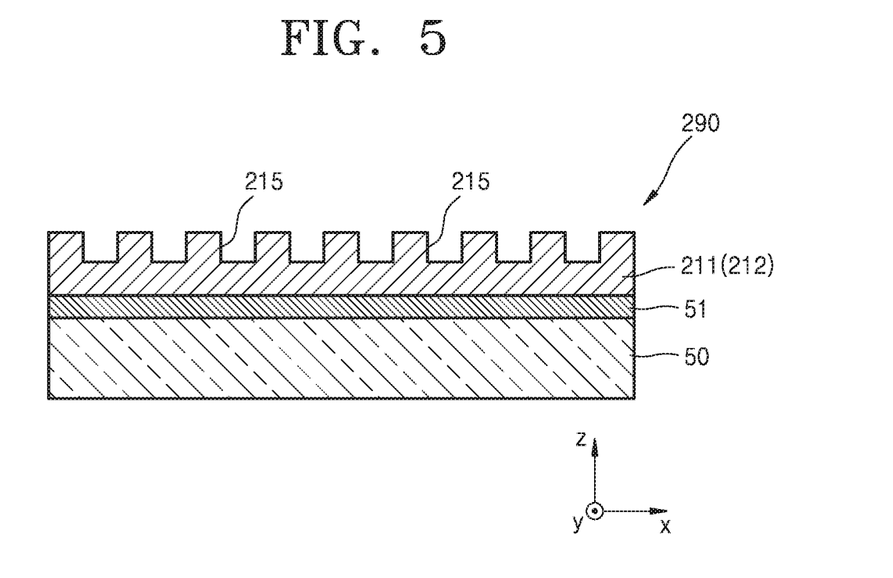
FIG. 5 is a cross-sectional view of a light output portion of the steering device of FIG. 1.

FIG. 5 is a cross-sectional view of one of the light output portions 290 of the steering device 200 of FIG. 1. Referring to FIG. 5, the light output portion 290 may have a grating structure in which a plurality of grooves 215 are cyclically formed in the third or fourth waveguide 211 or 212. The light may be output, for example, in a +z axis direction, by the interference between the first and second laser beams L1 and L2 transmitted through the grating structure of the light output portions 290. In this case, by changing the phase profiles of the first and second laser beams L1 and L2 through the first and second the modulation units 271 and 272, the light beams output from the light output portions 290 are steered, for example, in +y axis and −y axis directions, and by changing the wavelengths of the first and second laser beams L1 and L2 using the tunable laser source 100, the light beams output from the light output portions 290 are steered, for example, in +x axis and −x axis directions, thereby implementing two-dimensional light steering.

As illustrated in FIG. 1, the optical amplifiers 261 and 262 for amplifying the first and second laser beams L1 and L2 may be provided, as necessary, on the third and fourth waveguides 211 and 212 that are split. FIG. 1 exemplarily illustrates positions where the optical amplifiers 261 and 262 are provided. The position of the optical amplifiers 261 and 262 may be changed in any of various ways. The optical amplifiers 261 and 262 may include, for example, a semiconductor optical amplifier or an ion doped amplifier.

In the light steering apparatus according to the present example embodiment, since light is steered by simultaneously using two first and second laser beams L1 and L2 having optical coherence from among the first and second laser beams L1 and L2 output from the tunable laser source 100, light output power may be improved without loss of steering performance, compared to a case in which a single laser bean is used. Furthermore, when the maximum light output power of the light steering apparatus is limited, power consumption may be reduced, and the same light output power may be implemented even when the number of elements forming the light steering apparatus is reduced.

Figure 6:
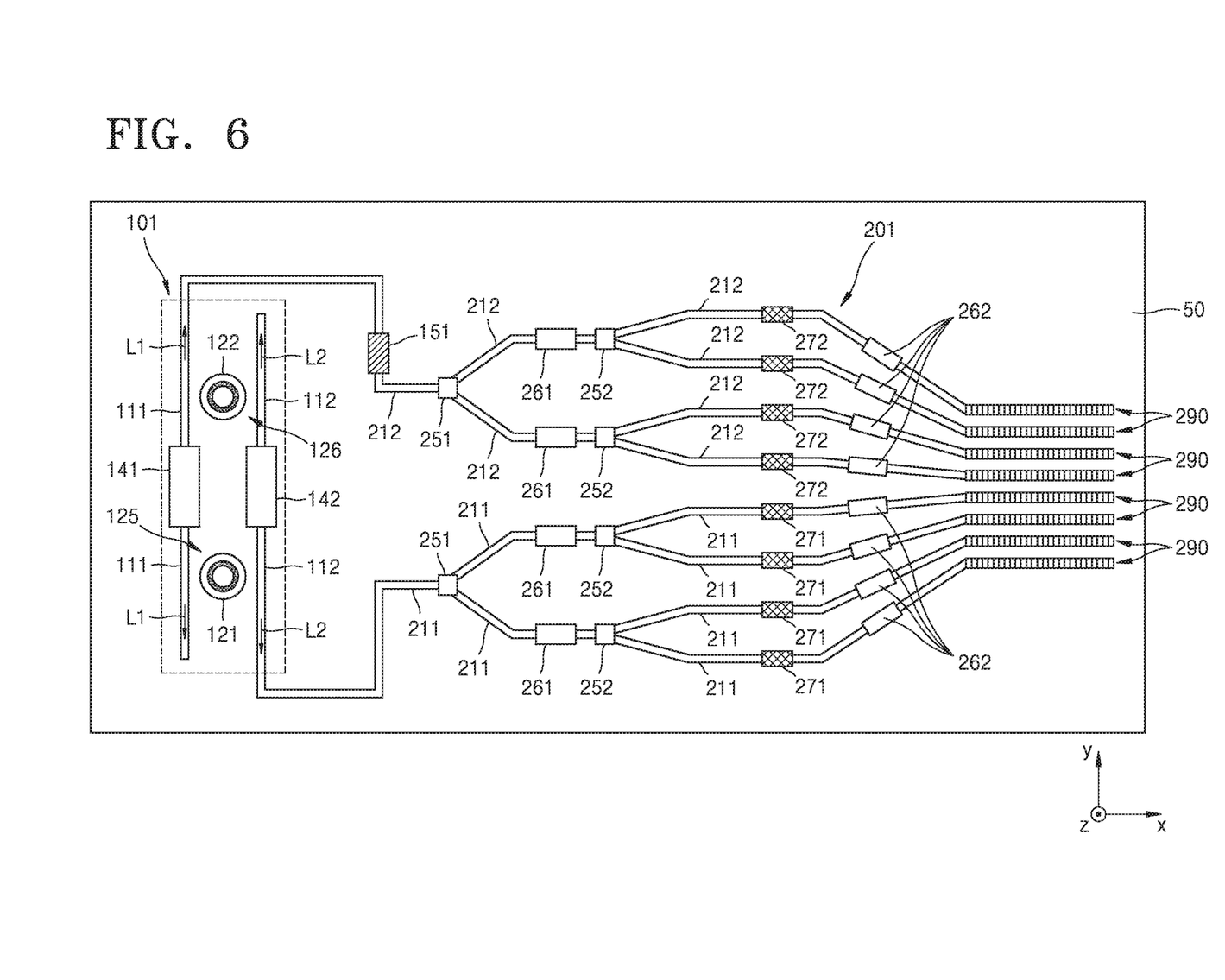
FIG. 6 is a plan view of a light steering apparatus according to another example embodiment.

FIG. 6 is a plan view of a light steering apparatus according to another example embodiment. The following description mainly focuses on differences from the above-described embodiment.

Referring to FIG. 6, the light steering apparatus may include a tunable laser source 101 and a steering device 201 for steering light output from the tunable laser source 101 in a desired direction. The tunable laser source 101 may include the first and second waveguides 111 and 112 arranged parallel to each other and the first and second ring resonators 125 and 126 between the first and second waveguides 111 and 112. The first waveguide 111 may be provided with the first optical amplifier 141, and the second waveguide 112 may be provided with the second optical amplifier 142.

The first laser beam L1 may be output from both sides of the first waveguide 111, and the second laser beam L2 may be output from both sides of the second waveguide 112. The first and second laser beams L1 and L2, output from opposite ends of the first and second waveguides (i.e. located in a diagonal direction with respect to each other, as shown in FIG. 6), from among all of the first laser beams L1 output from both sides of the first waveguide 111 and the second laser beams L2 output from both sides of the second waveguide 112 have guaranteed optical coherence with each other.

Unlike the above-described example embodiment, in the present example embodiment, the first laser beam L1 output from the one side of the first waveguide 111 (the first waveguide 111 located at the right side of the first optical amplifier 141, i.e. upwards in FIG. 6), and the second laser beam L2 output from the other side of the second waveguide 112 located in a diagonal direction with to the one side of the first waveguide 111 (the second waveguide 112 located at the left side of the second optical amplifier 142, i.e. downwards in FIG. 6), are used. There may be a time-independent phase difference between the first and second laser beams L1 and L2 having optical coherence, but the phase difference issue may be solved through the below-described phase difference compensation device 151.

The steering device 201 may steer light in a desired direction by using the first and second laser beams L1 and L2 having optical coherence and output from the tunable laser source 101, and may include the third and fourth waveguides 211 and 212, the splitters 251 and 252, and the modulation units 271 and 272.

In the present example embodiment, the first laser beam L1 output from the one side of the first waveguide 111 of the tunable laser source 101 may be incident on the fourth waveguide 212 of the steering device 201, and the second laser beam L2 output from the other side of the second waveguide 112 of the tunable laser source 101 may be incident on the third waveguide 211 of the steering device 201. In this case, the fourth waveguide 212 of the steering device 201 may be formed integrally with the first waveguide 111 of the tunable laser source 101, and the third waveguide 211 of the steering device 201 may be formed integrally with the second waveguide 112 of the tunable laser source 101.

The phase difference compensation device 151 may be provided on the fourth waveguide 212. The phase difference compensation device 151 may compensate for a phase difference between the first and second laser beams L1 and L2 by applying an electrical signal corresponding to the phase difference between the first and second laser beams L1 and L2 to the fourth waveguide 212 through which the first laser beam L1 passes. The phase difference compensation device 151 may be provided on the first waveguide 111 of the tunable laser source 101. Alternately, the phase difference compensation device 151 may be provided on the second waveguide 112 of the tunable laser source 101, or on both of the third and fourth waveguides 211 and 212 of the steering device 201.

The first laser beam L1 incident on the fourth waveguide 212 of the steering device 201 may pass through the fourth waveguides 212 that are split by the splitters 251 and 252, and the second laser beam L2 incident on the third waveguide 211 of the steering device 201 may pass through the third waveguides 211 that are split by the splitters 251 and 252. The modulation units 271 and 272 may include the first modulation units 271 provided on the third waveguides 211 that are split, and the second modulation units 272 provided on the fourth waveguides 212 that are split. Each of the first modulation units 271 may independently modulate the phase of the second laser beam L2 that passes through each of the third waveguides 211, and each of the second modulation units 272 may independently modulate the phase of the first laser beam L1 that passes through each of the fourth waveguides 212.

The first and second laser beams L1 and L2 having phases that are independently modulated by the first and second modulation units 271 and 272 may be output to the outside through the light output portions 290 provided at the end portions of the third and fourth waveguides 211 and 212. The light output portions 290 of the steering device 201 may be arranged on the substrate 50 in the form of a one-dimensional array.

Figure 7:
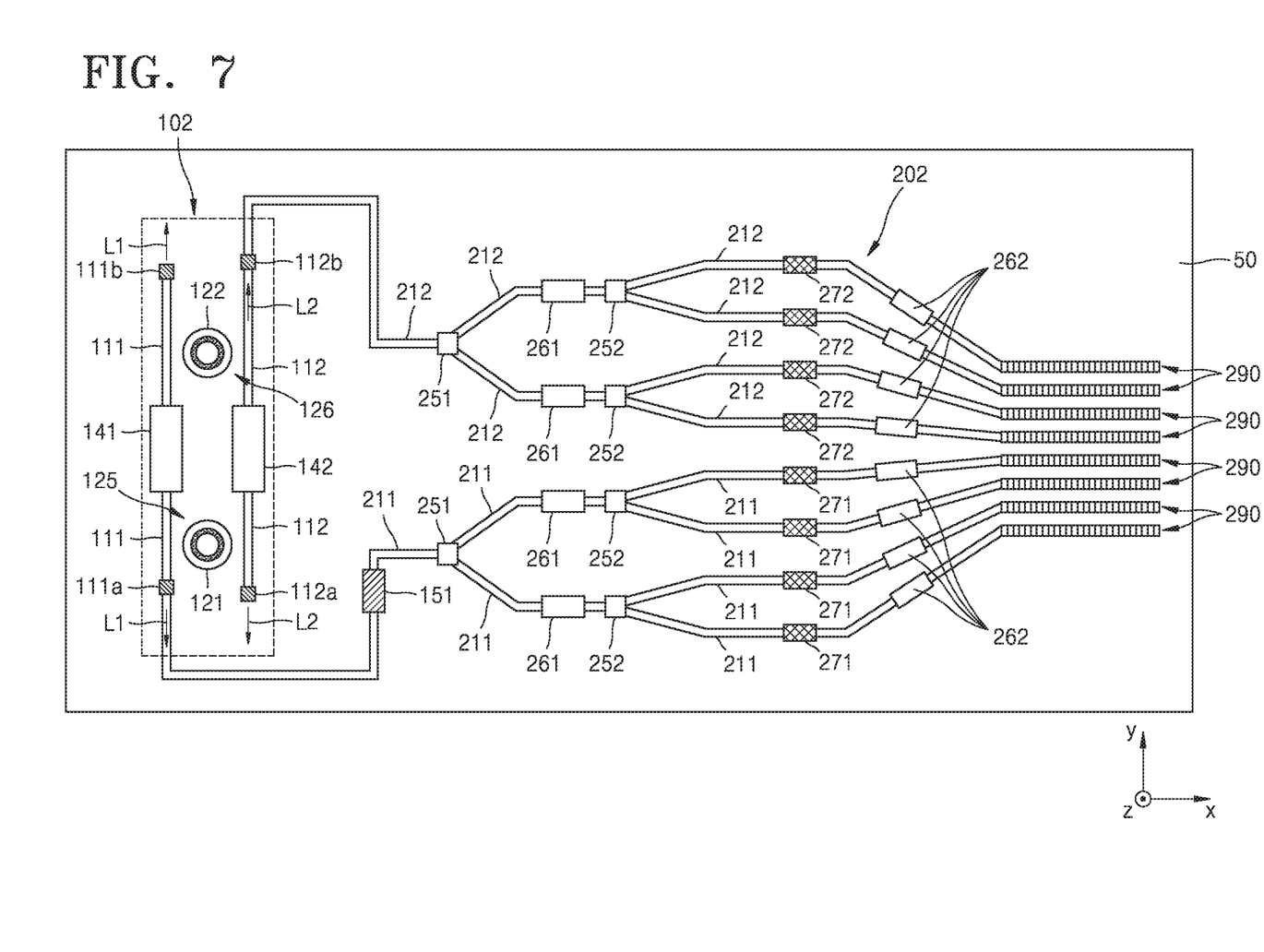
FIG. 7 is a plan view of a light steering apparatus according to another example embodiment.

FIG. 7 is a plan view of a light steering apparatus according to another example embodiment.

Referring to FIG. 7, the light steering apparatus may include a tunable laser source 102 and a steering device 202 for steering light output from the tunable laser source 102 in a desired direction. The tunable laser source 102 may include the first and second waveguides 111 and 112 arranged parallel to each other and the first and second ring resonators 125 and 126 between the first and second waveguides 111 and 112. The first optical amplifier 141 may be provided on the first waveguide 111, and the second optical amplifier 142 may be provided on the second waveguide 112.

First and second output ports 111a and 111b are provided at opposite sides of the first waveguide 111, and third and fourth output ports 112a and 112b are provided at opposite sides of the second waveguide 112. The first laser beam L1 may be output from each of the first and second output ports 111a and 111b of the first waveguide 111, and the second laser beam L2 may be output from each of the third and fourth output ports 112a and 112b of the second waveguide 112.

The first and second laser beams L1 and L2, output from opposite ends of the first and second waveguides (i.e. output from the first and fourth output ports 111a and 112b, or output from the second and third output ports 111b and 112a (i.e. located in a diagonal direction with respect to each other) have guaranteed optical coherence with each other. In detail, the first laser beam L1 output from the first output port 111a of the first waveguide 111 and the second laser beam L2 output from the fourth output port 112b of the second waveguide 112 have guaranteed optical coherence with each other; and the first laser beam L1 output from the second output port 111b of the first waveguide 111 and the second laser beam L2 output from the third output port 112a of the second waveguide 112 have guaranteed optical coherence with each other. FIG. 7 illustrates a case in which the light steering apparatus uses the first laser beam L1 output from the first output port 111a of the first waveguide 111 and the second laser beam L2 output from the fourth output port 112b of the second waveguide 112.

The steering device 202 may steer light in a desired direction by using the first and second laser beams L1 and L2 having optical coherence and output from the tunable laser source 102, and may include the third and fourth waveguides 211 and 212, the splitters 251 and 252, and the modulation units 271 and 272.

The third waveguide 211 of the steering device 202 may be connected to the first output port 111a of the first waveguide 111, and the fourth waveguide 212 of the steering device 202 may be connected to the fourth output port 112b of the second waveguide 112. Accordingly, the first laser beam L1 output from the first output port 111a of the first waveguide 111 may be incident on the third waveguide 211 of the steering device 202, and the second laser beam L2 output from the fourth output port 112b of the second waveguide 112 may be incident on the fourth waveguide 212 of the steering device 202.

The phase difference compensation device 151 may be provided on the third waveguide 211. The phase difference compensation device 151 may compensate for a phase difference between the first and second laser beams L1 and L2 by applying an electrical signal corresponding to the phase difference between the first and second laser beams L1 and L2 to the third waveguide 211 through which the first laser beam L1 passes. The phase difference compensation device 151 may be provided on the first waveguide 111 of the tunable laser source 100. Alternately, the phase difference compensation device 151 may be provided on the fourth waveguide 212 of the steering device 202, or on both of the third and fourth waveguides 211 and 212 of the steering device 202.

The first laser beam L1 incident on the third waveguide 211 of the steering device 202 passes through the third waveguides 211 that are split by the splitters 251 and 252, and the second laser beam L2 incident on the fourth waveguide 212 of the steering device 202 passes through the fourth waveguides 212 that are split by the splitters 251 and 252. The modulation units 271 and 272 may include the first modulation units 271 provided on the third waveguides 211 that are split and the second modulation units 272 provided on the fourth waveguides 212 that are split. Each of the first modulation units 271 may independently modulate the phase of a first laser beam L1 that passes through one of the third waveguides 211, and each of the second modulation units 272 may independently modulate the phase of a second laser beam L2 that passes through one of the fourth waveguides 212.

The first and second laser beams L1 and L2 having phases that are independently modulated by the first and second modulation units 271 and 272 may be output to the outside through the light output portions 290 provided at the end portions of the third and fourth waveguides 211 and 212. The light output portions 290 of the steering device 202 may be arranged on the substrate 50 in the form of one-dimensional array.

FIG. 7 illustrates a case in which the light steering apparatus uses the first laser beam L1 output from the first output port 111a of the first waveguide 111 and the second laser beam L2 output from the fourth output port 112b of the second waveguide 112. However, the light steering apparatus may use the first laser beam L1 output from the second output port 111b of the first waveguide 111 and the second laser beam L2 output from the third output port 112a of the second waveguide 112.

Figure 8:
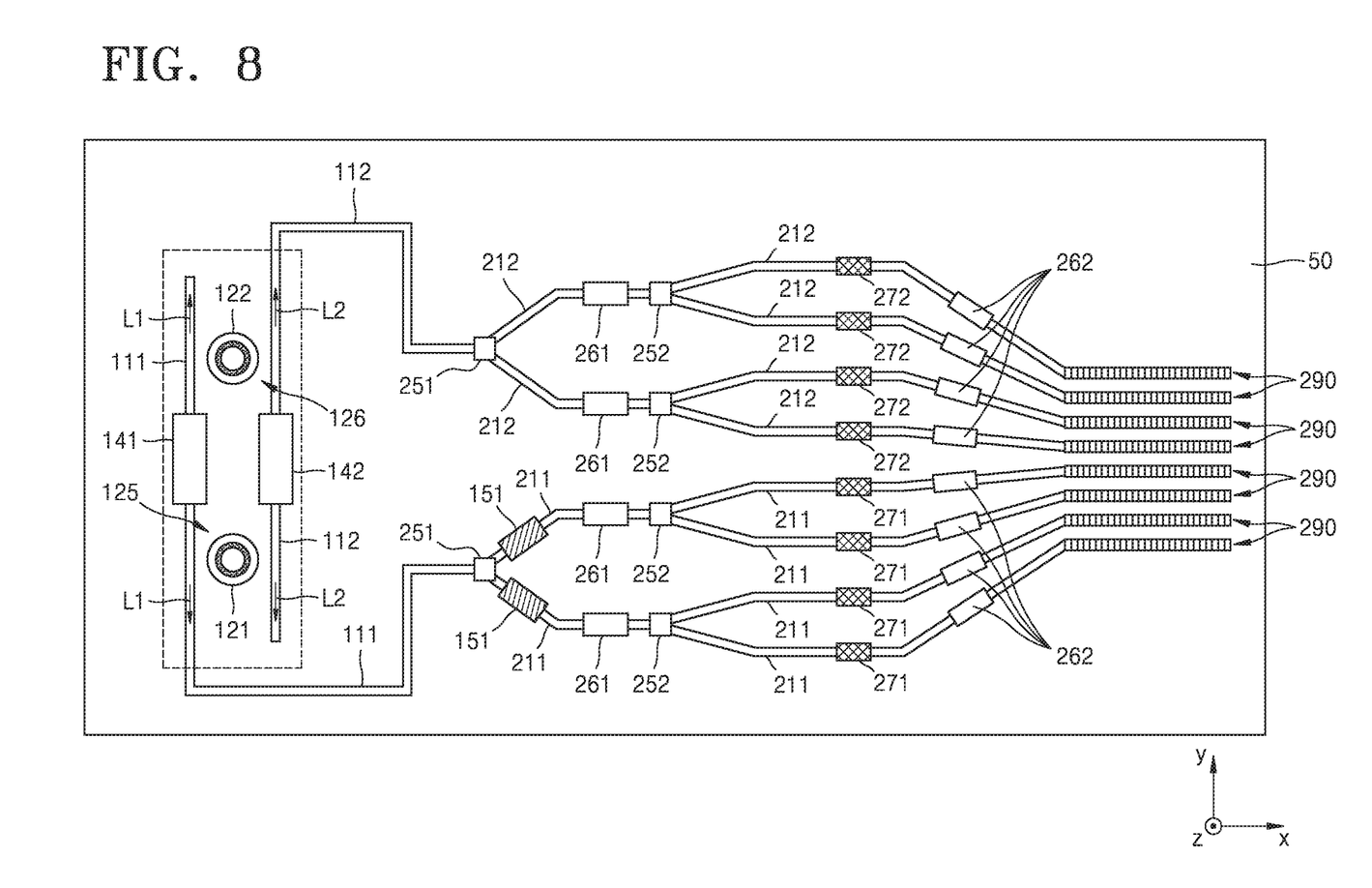
FIG. 8 is a plan view of a light steering apparatus according to another example embodiment.
Figure 9:
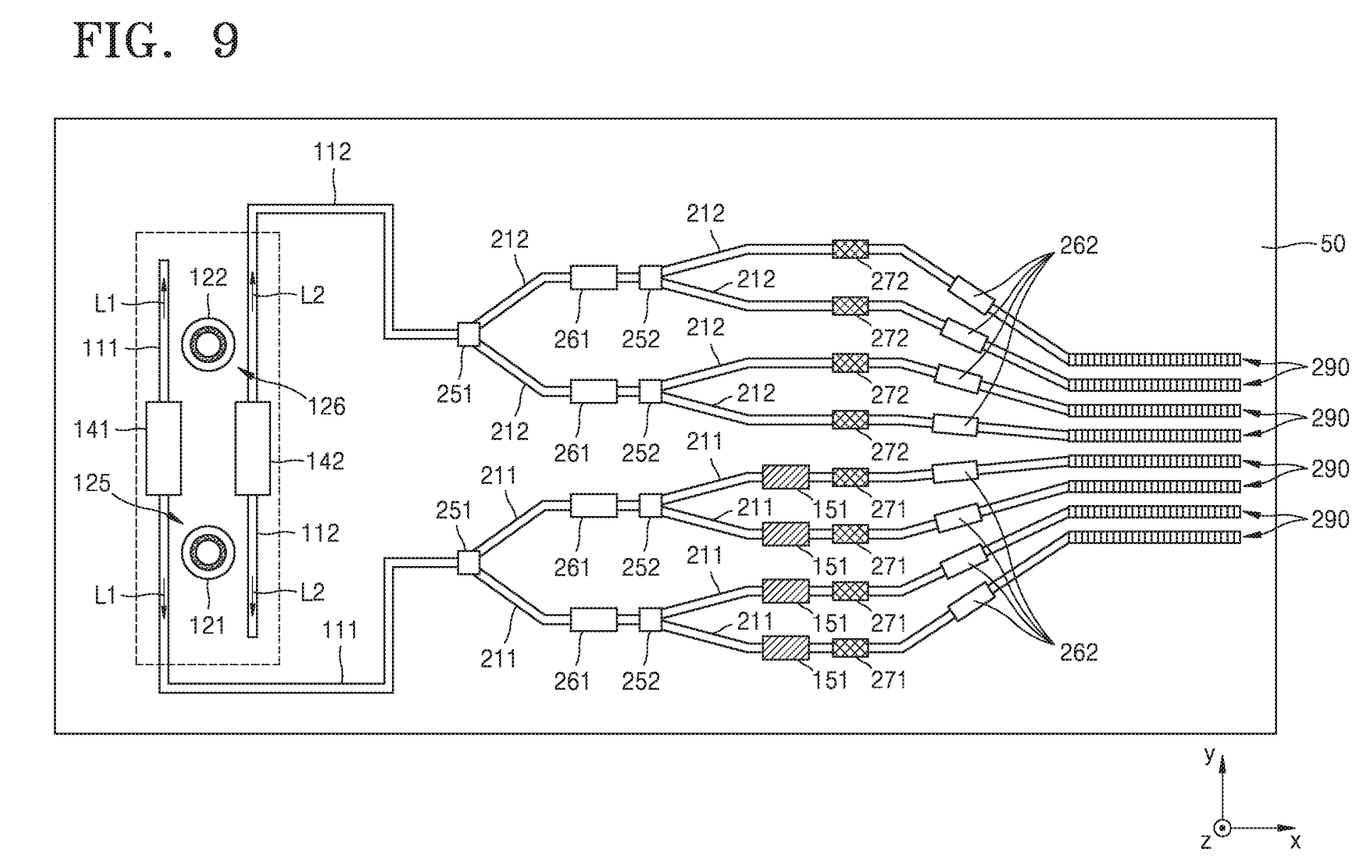
FIG. 9 is a plan view of a light steering apparatus according to another example embodiment.
Figure 10:
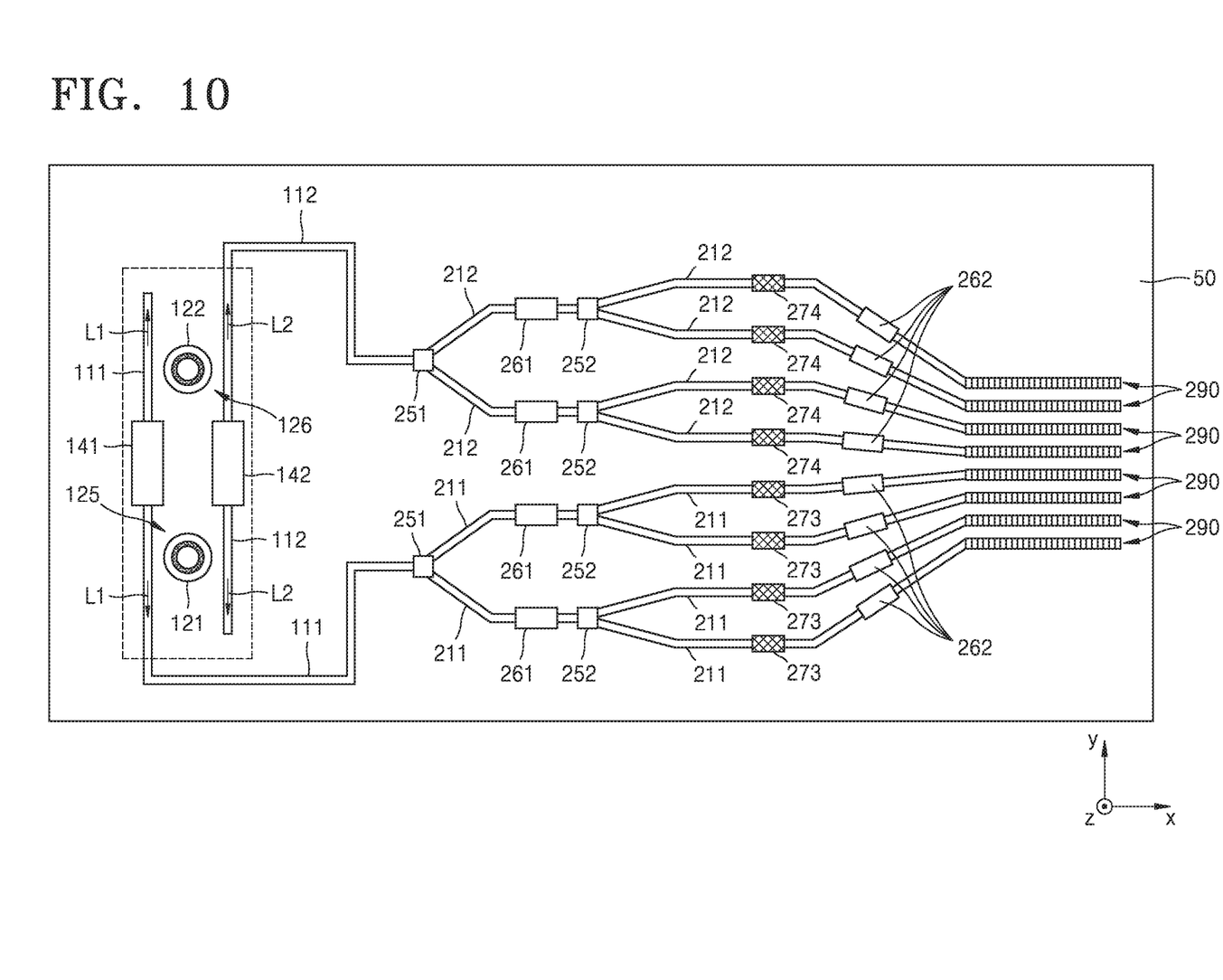
FIG. 10 is a plan view of a light steering apparatus according to another example embodiment.

FIGS. 8 to 10 illustrate light steering apparatuses in which the phase difference compensation device 151 is located at various positions.

Referring to FIG. 8, the phase difference compensation device 151 is provided on each of the third waveguides 211 that are split by the first splitter 251. The phase difference compensation device 151 may compensate for a phase difference between the first and second laser beams L1 and L2 by applying an electrical signal corresponding to the phase difference between the first and second laser beams L1 and L2 to the third waveguides 211 through which the first laser beam L1 passes. The phase difference compensation device 151 may be provided on each of the fourth waveguides 212 that are split by the first splitter 251. In this case, the phase difference compensation device 151 may apply an electrical signal corresponding to the phase difference between the first and second laser beams L1 and L2 to the fourth waveguide 212 through which the second laser beam L2 passes. Alternately, the phase difference compensation device 151 may be provided on both of the third and fourth waveguides 211 and 212 that are split by the first splitter 251.

Referring to FIG. 9, the phase difference compensation device 151 is provided on each of the third waveguides 211 that are split by the second splitter 252. The phase difference compensation device 151 may compensate for the phase difference between the first and second laser beams L1 and L2 by applying an electrical signal corresponding to the phase difference between the first and second laser beams L1 and L2 to the third waveguides 211 through which the first laser beam L1 passes. The phase difference compensation device 151 may be provided on each of the fourth waveguides 212 that are split by the second splitter 252. In this case, the phase difference compensation device 151 may apply an electrical signal corresponding to the phase difference between the first and second laser beams L1 and L2 to the fourth waveguides 212 through which the second laser beam L2 passes. Alternately, the phase difference compensation device 151 may be provided on both of the third and fourth waveguides 211 and 212 that are split by the second splitter 252.

Referring to FIG. 10, a plurality of modulation units 273 and 274 may modulate the phases of the first and second laser beams L1 and L2 and simultaneously compensate for the phase difference between the first and second laser beams L1 and L2. The modulation units 273 and 274 may include the first modulation units 273 provided on the third waveguides 211 that are split and the second modulation units 274 provided on the fourth waveguides 212 that are split.

For example, the first modulation units 273 may compensate for the phase difference between the first and second laser beams L1 and L2. In this case, each of the first modulation units 273 may apply an electrical signal corresponding to the phase difference between the first and second laser beams L1 and L2 to the third waveguides 211 and simultaneously modulate the phase of the first laser beam L1 that passes through the third waveguides 211. Each of the second modulation units 274 may modulate the phase of the second laser beam L2 that passes through the fourth waveguides 212. The second modulation units 274 may compensate for the phase difference between the first and second laser beams L1 and L2, and both of the first and second modulation units 273 and 274 may compensate for the phase difference between the first and second laser beams L1 and L2.

According to the above-described example embodiments, the light steering apparatus may improve light output power by simultaneously using two laser beams having optical coherence from among laser beams output from a tunable laser source, without loss of steering performance when the same amount of power is consumed as compared to a case of using a single laser beam. Furthermore, when the same amount of light output power is implemented, power consumption may be reduced, and the number of elements needed for configuring a light steering apparatus may be reduced.

Figure 11:
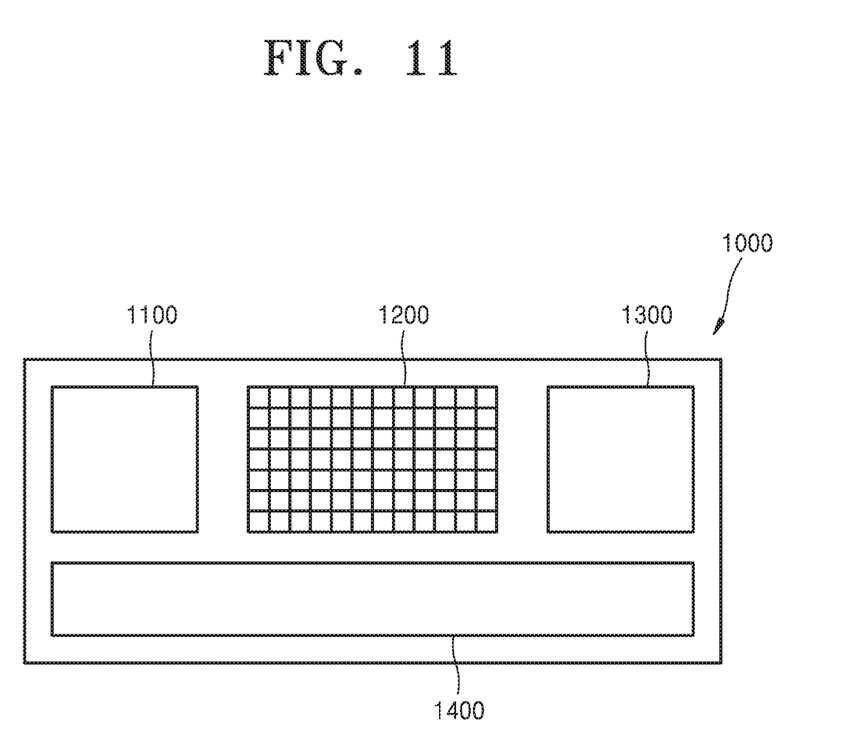
FIG. 11 schematically illustrates a system according to another example embodiment.

FIG. 11 schematically illustrates a system 1000 according to another example embodiment. In FIG. 11, the system 1000 includes the above-described light steering apparatus.

Referring to FIG. 11, the system 1000 according to the present example embodiment may include a tunable laser source 1100, a steering device 1200 for steering light in a desired direction, a detection unit 1300 for detecting steered light, and a driving driver 1400. The driving driver 1400 may include a driving circuit for driving the tunable laser source 1100, the steering device 1200, and the detection unit 1300.

The tunable laser source 1100 may be a laser source that emits light by changing the wavelength of light to a wide bandwidth. The tunable laser source 1100 may emit a plurality of laser beams, and laser beams having optical coherence with each other, from among a plurality of laser beams, may be incident on the steering device 1200. The tunable laser source 1100 may include the tunable laser sources 100, 101, and 102 described in the above-described example embodiments.

The steering device 1200 may steer light in a desired direction by using a plurality of laser beams output from the tunable laser source 1100. The steering device 1200 may include one of the steering devices 200, 201, and 202 that are described in the above-described example embodiments. When the light steered by the steering device 1200 is irradiated onto and reflected from an object, the detection unit 1300 may detect the reflected light. The system 1000 may be applied to any of various fields, for example, depth sensors, 3D sensors, or light detection and ranging (LiDAR).

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A light steering apparatus comprising:
a tunable laser source configured to output a plurality of optically coherent laser beams, the tunable laser source comprising a first waveguide and a second waveguide, the first waveguide comprising a first side and a second side, and the second waveguide comprising a first side, adjacent to the first side of the first waveguide, and a second side, adjacent to the second side of the first waveguide; and
a steering device on which the plurality of optically coherent laser beams, output from the tunable laser source, are incident, the steering device comprising a plurality of modulation units configured to beam steer the plurality of optically coherent laser beams,
wherein the plurality of optically coherent laser beams comprises a first laser beam output from the first side of the first waveguide and a second laser beam output from the second side of the second waveguide, and the first laser beam and the second laser beam have a time-independent phase difference with respect to each other, and
wherein the light steering apparatus further comprises a phase difference compensation device configured to compensate for the time-independent phase difference between the first laser beam and the second laser beam.

2. The light steering apparatus of claim 1, further comprising:
a plurality of input/output connection structures connecting the tunable laser source to the steering device, each of the plurality of input/output connection structures corresponding to one of the plurality of optically coherent laser beams.

3. The light steering apparatus of claim 2, wherein the tunable laser source comprises:
a first ring resonator disposed between the first waveguide and the second waveguide; and
a second ring resonator disposed between the first waveguide and the second waveguide and spaced apart from the first ring resonator.

4. The light steering apparatus of claim 3, wherein the tunable laser source further comprises an optical amplifier on at least one of the first waveguide and the second waveguide.

5. The light steering apparatus of claim 4, wherein each of the first ring resonator and the second ring resonator comprises a ring waveguide and a modulator.

6. The light steering apparatus of claim 5, wherein the modulator comprises one of:
a heating element configured to heat the ring waveguide,
an electro-optic element configured to change a charge density of the ring waveguide by applying a current around the ring waveguide, and
a piezoelectric element configured to change a refractive index of the ring waveguide, or a material surrounding the ring waveguide, according to application of a voltage.

7. The light steering apparatus of claim 3, wherein the tunable laser source further comprises:
a first output port at the first side of the first waveguide, a second output port at the second side of the first waveguide, a third output port at the first side of the second waveguide, and a fourth output port at the second side of the second waveguide.

8. The light steering apparatus of claim 3, wherein the steering device comprises a third waveguide, connected to the first side of the first waveguide, on which the first laser beam is incident; and a fourth waveguide, connected to the second side of the second waveguide, on which the second laser beam is incident.

9. The light steering apparatus of claim 8, wherein the first waveguide and the third waveguide are integrally formed, and the second waveguide and the fourth waveguide are integrally formed.

10. The light steering apparatus of claim 8, wherein the steering device further comprises a splitter configured to split the third waveguide into a plurality of third waveguides and a splitter configured to split the fourth waveguide into a plurality of fourth waveguides.

11. The light steering apparatus of claim 10, wherein one of the plurality of modulation units is configured to modulate a phase of a beam that pass through each of the plurality of third waveguides and the plurality of fourth waveguides.

12. The light steering apparatus of claim 1, wherein the phase difference compensation device is provided on at least one of a path of the first laser beam and a path of the second laser beam and the phase difference compensation device is further configured to apply an electrical signal corresponding to the time-independent phase difference between the first laser beam and the second laser beam.

13. The light steering apparatus of claim 1, wherein at least one of the plurality of modulation units is configured to apply an electrical signal corresponding to the time-independent phase difference between the first laser beam and the second laser beam.

14. The light steering apparatus of claim 1, wherein the steering device comprises a plurality of light output portions arranged in a one-dimensional array.

15. A system comprising:
- a tunable laser source configured to output a plurality of optically coherent laser beams, the tunable laser source comprising a first waveguide and a second waveguide, the first waveguide comprising a first side and a second side, and the second waveguide comprising a first side, adjacent to the first side of the first waveguide, and a second side, adjacent to the second side of the first waveguide;
- a steering device on which the plurality of optically coherent laser beams, output from the tunable laser source, are incident, the steering device comprising a plurality of modulation units configured to beam steer the plurality of optically coherent laser beams; and
- a detection unit configured to detect a beam steered by the steering device,
- wherein the plurality of optically coherent laser beams comprises a first laser beam output from the first side of the first waveguide and a second laser beam output from the second side of the second waveguide, and the first laser beam and the second laser beam have a time-independent phase difference with respect to each other, and
- wherein the system further comprises a phase difference compensation device configured to compensate for the time-independent phase difference between the first laser beam and the second laser beam.

16. The system of claim 15, wherein the tunable laser source comprises:
- a first ring resonator disposed between the first waveguide and the second waveguide;
- a second ring resonator disposed between the first waveguide and the second waveguide and spaced apart from the first ring resonator; and
- an optical amplifier provided on at least one of the first waveguide and the second waveguide.

* * * * *